US012016203B2

(12) United States Patent
Kim et al.

(10) Patent No.: US 12,016,203 B2
(45) Date of Patent: Jun. 18, 2024

(54) DISPLAY DEVICE INCLUDING STRESSORS

(71) Applicant: SAMSUNG DISPLAY CO., LTD., Yongin-si (KR)

(72) Inventors: Junehwan Kim, Yongin-si (KR); Taeyoung Kim, Yongin-si (KR); Jongwoo Park, Yongin-si (KR); Kiju Im, Yongin-si (KR); Hyuncheol Hwang, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 372 days.

(21) Appl. No.: 17/140,660

(22) Filed: Jan. 4, 2021

(65) Prior Publication Data
US 2021/0335926 A1 Oct. 28, 2021

(30) Foreign Application Priority Data

Apr. 22, 2020 (KR) .................. 10-2020-0048851

(51) Int. Cl.
*H10K 59/12* (2023.01)
*G09G 3/3233* (2016.01)
(Continued)

(52) U.S. Cl.
CPC ........... *H10K 59/12* (2023.02); *G09G 3/3233* (2013.01); *G09G 2320/0233* (2013.01);
(Continued)

(58) Field of Classification Search
CPC ............ H01L 27/3244; H01L 27/3262; H01L 27/3246; H01L 27/3248; H01L 27/3258;
(Continued)

(56) References Cited

U.S. PATENT DOCUMENTS 5,037,766 A * 8/1991 Wang ................ H01L 21/32155
438/161
6,800,910 B2 10/2004 Lin et al.
(Continued)

FOREIGN PATENT DOCUMENTS

CN 109477206 A * 3/2019 ............. B28B 1/008
KR 101030031 B1 * 4/2011 ........... H01L 29/786
(Continued)

OTHER PUBLICATIONS

M. Horstmann et al., "Integration and Optimization of Embedded-SiGe, Compressive and Tensile Stressed Liner Films, and Stress Memorization in Advanced SOI CMOS Technologies," IEEE, 2005, 4 pages.

*Primary Examiner* — Ida M Soward
(74) *Attorney, Agent, or Firm* — CANTOR COLBURN LLP

(57) ABSTRACT

A display device having a thin-film transistor with increased mobility of electrons or holes includes a first semiconductor layer arranged on a substrate and including a first channel region, a first source region, and a first drain region; a first stressor arranged between the substrate and the first semiconductor layer and which overlaps the first source region in a plan view; a second stressor arranged between the substrate and the first semiconductor layer and which overlaps the first drain region in the plan view, where the second stressor is spaced apart from the first stressor; a gate insulating layer arranged on the first semiconductor layer; and a first gate electrode arranged on the gate insulating layer and which overlaps the first semiconductor layer in the plan view.

8 Claims, 12 Drawing Sheets

(51) Int. Cl.
| | |
|---|---|
| H01L 29/10 | (2006.01) |
| H01L 29/66 | (2006.01) |
| H01L 29/78 | (2006.01) |
| H01L 29/786 | (2006.01) |
| H10K 10/46 | (2023.01) |
| H10K 59/121 | (2023.01) |
| H10K 59/35 | (2023.01) |
| H10K 77/10 | (2023.01) |
| H10K 102/00 | (2023.01) |

(52) U.S. Cl.
CPC .... *H01L 29/1054* (2013.01); *H01L 29/66757* (2013.01); *H01L 29/7842* (2013.01); *H01L 29/78666* (2013.01); *H01L 29/78675* (2013.01); *H01L 2924/13069* (2013.01); *H10K 10/464* (2023.02); *H10K 59/1213* (2023.02); *H10K 59/35* (2023.02); *H10K 77/111* (2023.02); *H10K 2102/311* (2023.02)

(58) Field of Classification Search
CPC ............. H01L 27/1218; H01L 27/1222; H01L 27/124; H01L 27/3211; H01L 29/78618; H01L 29/78606; H01L 29/78651; H01L 51/0097; H01L 29/1054; H01L 29/78666; H01L 29/66757; H01L 29/7842; H01L 29/78675; H01L 2924/13069; G09G 3/3233; G09G 2320/0233; G09G 2300/0426; H10K 10/464; H10K 59/12; H10K 59/1213; H10K 59/35; H10K 59/122; H10K 59/123; H10K 59/124; H10K 77/111; H10K 2102/311
See application file for complete search history.

(56) References Cited

U.S. PATENT DOCUMENTS

| | | | |
|---|---|---|---|
| 7,193,322 B2 | 3/2007 | Lee et al. | |
| 7,227,205 B2 | 6/2007 | Bryant et al. | |
| 7,618,856 B2 | 11/2009 | Ting et al. | |
| 8,884,298 B2 | 11/2014 | Maeda et al. | |
| 9,129,952 B2 | 9/2015 | Shin et al. | |
| 9,653,614 B2* | 5/2017 | Yamazaki | H01L 29/4908 |
| 10,964,790 B1* | 3/2021 | Yan | H01L 27/124 |
| 2003/0094611 A1* | 5/2003 | Hayakawa | H01L 21/02496 257/E27.111 |
| 2006/0151833 A1* | 7/2006 | Yang | H01L 21/84 257/E29.295 |
| 2006/0270122 A1* | 11/2006 | Lee | H10K 10/84 438/149 |
| 2007/0018236 A1* | 1/2007 | Tsuchiaki | H01L 29/78687 257/E29.147 |
| 2008/0145979 A1 | 6/2008 | Huang et al. | |
| 2008/0203427 A1* | 8/2008 | Mowry | H01L 21/823814 257/190 |
| 2009/0256151 A1* | 10/2009 | Huh | H01L 29/66765 257/288 |
| 2010/0006851 A1* | 1/2010 | Park | H01L 29/41733 257/E21.16 |
| 2011/0169009 A1* | 7/2011 | Lee | H01L 27/1281 438/34 |
| 2011/0169010 A1* | 7/2011 | Park | H01L 27/1251 438/34 |
| 2011/0297949 A1* | 12/2011 | Lee | H01L 27/1281 438/22 |
| 2012/0161122 A1* | 6/2012 | Yamazaki | H01L 29/7869 257/43 |
| 2012/0178224 A1* | 7/2012 | Yamazaki | H01L 29/7869 438/151 |
| 2012/0199880 A1* | 8/2012 | Matsuda | H01L 21/02483 257/288 |
| 2013/0049002 A1* | 2/2013 | Chen | H01L 29/7869 257/E21.409 |
| 2013/0069055 A1* | 3/2013 | Yamazaki | H01L 29/78693 257/43 |
| 2014/0167164 A1* | 6/2014 | Adam | H01L 29/78654 438/585 |
| 2015/0236285 A1* | 8/2015 | Afzali-Ardakani | G06N 3/063 257/24 |
| 2016/0268320 A1* | 9/2016 | Long | H01L 29/4908 |
| 2018/0182986 A1* | 6/2018 | Liu | H10K 10/484 |
| 2019/0273165 A1* | 9/2019 | Hekmatshoartabari | H01L 21/02579 |
| 2020/0006386 A1* | 1/2020 | Singh | H01L 29/66772 |

FOREIGN PATENT DOCUMENTS

| | | |
|---|---|---|
| KR | 101909204 B1 | 10/2018 |
| KR | 102059526 B1 | 12/2019 |
| TW | 515103 B * | 12/2002 ....... H01L 29/66765 |

* cited by examiner

DISPLAY DEVICE INCLUDING STRESSORS

This application claims priority to Korean Patent Application No. 10-2020-0048851, filed on Apr. 22, 2020, and all the benefits accruing therefrom under 35 U.S.C. § 119, the content of which in its entirety is herein incorporated by reference.

BACKGROUND

1. Field

One or more embodiments relate to a display device, and more particularly, to a display device having a thin-film transistor with increased mobility of electrons or holes.

2. Description of Related Art

A display device visually displays data. A display device may be used in a small-sized product such as a mobile phone or a large-sized product such as a television.

A display device includes a plurality of pixels that receive electrical signals and emit light to display images to the outside. Each of the pixels includes a light-emitting element. For example, an organic light-emitting display device includes an organic light-emitting diode as a light-emitting element. In general, in an organic light-emitting display device, thin-film transistors and organic light-emitting diodes are arranged on a substrate, and the organic light-emitting diodes emit light by themselves.

Recently, as use of display devices has increased, various designs for improving the quality thereof have been developed.

SUMMARY

In an existing display device, the mobility of electrons or holes in a thin-film transistor is not proper for high-speed driving of the display device.

In order to solve various problems including the above problem, one or more embodiments include a display device having a thin-film transistor with increased mobility of electrons or holes. However, this objective is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display device includes a first semiconductor layer arranged on a substrate and including a first channel region, a first source region, and a first drain region; a first stressor arranged between the substrate and the first semiconductor layer and which overlaps the first source region in a plan view; a second stressor arranged between the substrate and the first semiconductor layer and which overlaps the first drain region in the plan view, where the second stressor is spaced apart from the first stressor; a gate insulating layer arranged on the first semiconductor layer; and a first gate electrode arranged on the gate insulating layer and which overlaps the first semiconductor layer in the plan view.

The display device may further include a buffer layer arranged between the substrate and the first stressor and which defines a first groove and a second groove, where a portion of the first stressor may be buried in the first groove, and a portion of the second stressor may be buried in the second groove.

The display device may further include a buffer layer arranged between the substrate and the first stressor and which defines a first through-hole and a second through-hole exposing a portion of the substrate, where a portion of the first stressor may be buried in the first through-hole, and a portion of the second stressor may be buried in the second through-hole.

A distance from a bottom surface of the substrate to a top surface of the first channel region in a thickness direction may be less than a distance from the bottom surface of the substrate to a top surface of the first source region.

A first thin-film transistor may include the first semiconductor layer and the first gate electrode, where the first thin-film transistor may be a switching thin-film transistor.

Each of the first stressor and the second stressor may have a compressive film stress.

A distance between particles of a material in the first stressor and a distance between particles of a material in the second stressor each may be greater than a distance between particles of a material in the first semiconductor layer.

According to one or more embodiments, a display device includes a first semiconductor layer arranged on a substrate and including a first channel region, a first source region, and a first drain region; a third stressor arranged between the substrate and the first semiconductor layer and which overlaps the first semiconductor layer in a plan view; a first gate insulating layer arranged on the first semiconductor layer; and a first gate electrode arranged on the first gate insulating layer and which overlaps the first semiconductor layer, where a distance between particles of a material in the first semiconductor layer is different from a distance between particles of a material in the third stressor.

The display device may further include a second semiconductor layer arranged on the substrate and including a second channel region, a second source region, and a second drain region; a second gate insulating layer arranged on the first gate insulating layer and the first gate electrode; and a second gate electrode arranged on the second gate insulating layer and which overlaps the second semiconductor layer in the plan view, where the first gate insulating layer may be arranged on the second semiconductor layer.

A first thin-film transistor may include the first semiconductor layer and the first gate electrode, and a second thin-film transistor may include the second semiconductor layer and the second gate electrode, where the first thin-film transistor may be a switching thin-film transistor, and the second thin-film transistor may be a driving thin-film transistor.

The display device may further include a second semiconductor layer arranged on the substrate and including a second channel region, a second source region, and a second drain region; a fourth stressor arranged between the substrate and the second semiconductor layer and which overlaps the second semiconductor layer in the plan view, where the fourth stressor may be spaced apart from the third stressor; and a second gate electrode arranged on the first gate insulating layer and which overlaps the second semiconductor layer in the plan view, where a distance between particles of a material in the second semiconductor layer is different from a distance between particles of a material in the fourth stressor.

The third stressor and the fourth stressor may be patterned.

The display device may further include a fifth stressor arranged on the second semiconductor layer and which overlaps the second semiconductor layer in the plan view, where the fifth stressor is spaced apart from the third stressor and the fourth stressor.

The fourth and fifth stressors may have different types of film stress.

The third stressor and the fourth stressor may each have a compressive film stress, and the fifth stressor may have a tensile film stress.

The third stressor may include an isolated pattern.

The third stressor may have a compressive or tensile film stress.

A distance between particles of a material in the third stressor may be greater than a distance between particles of a material in the first semiconductor layer.

According to one or more embodiments, a display device includes a second semiconductor layer arranged on a substrate and including a silicon semiconductor material; a first gate insulating layer arranged on the second semiconductor layer; a second gate electrode arranged on the first gate insulating layer and which overlaps the second semiconductor layer in a plan view; an insulating layer arranged on the second gate electrode; a third semiconductor layer arranged on the insulating layer and including a third channel region, a third source region, and a third drain region, where the third semiconductor layer includes an oxide semiconductor material; a sixth stressor arranged between the insulating layer and the third semiconductor layer and which overlaps the third semiconductor layer; a second gate insulating layer arranged on the third semiconductor layer, and a third gate electrode arranged on the second gate insulating layer and which overlaps the third semiconductor layer, where a distance between particles of a material in the third semiconductor layer is different from a distance between particles of a material in the sixth stressor.

The sixth stressor may have a tensile film stress.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
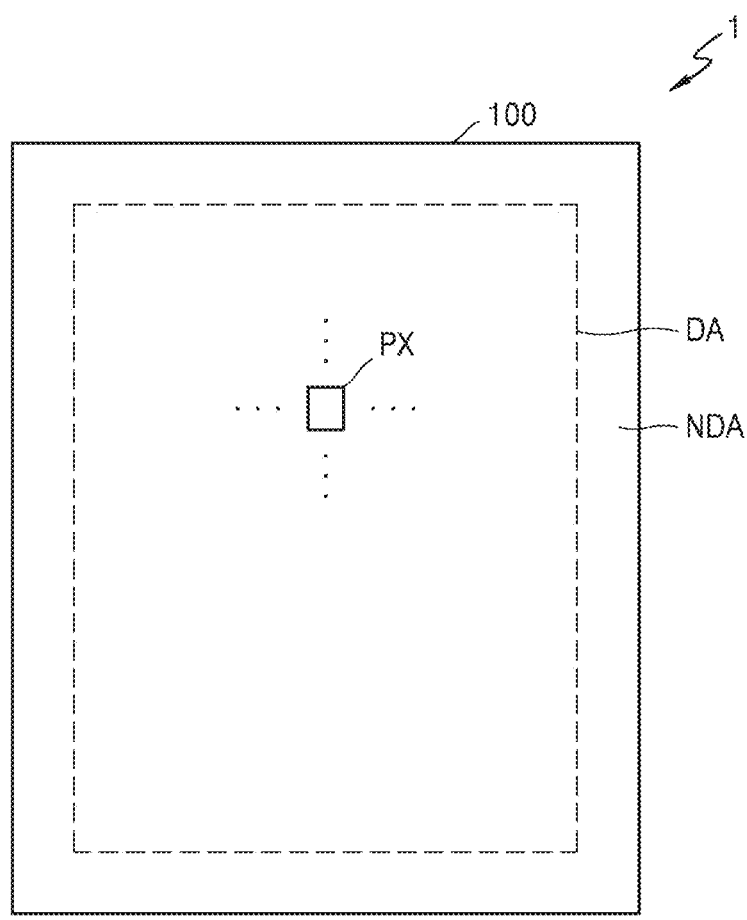
FIG. 1 is a schematic plan view illustrating a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The attached drawings for illustrating one or more embodiments are referred to in order to gain a sufficient understanding, the merits thereof, and the objectives accomplished by the implementation. However, the embodiments may have different forms and should not be construed as being limited to the descriptions set forth herein.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, such components are not to be limited to the above terms. The above terms are used only to distinguish one component from another.

An expression used in the singular encompasses the expression of the plural, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on," another layer, region, or component, it may be directly or indirectly formed on the other layer, region, or component. That is, for example, intervening layers, regions, or components may be present. It will be understood that when an element is referred to as "overlaps" another element, it may completely or partially overlap the element.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments below, when layers, areas, or elements or the like are referred to as being "connected," it will be understood that they may be directly connected or an intervening portion may be present between layers, areas or elements. For example, when layers, areas, or elements or the like are referred to as being "electrically connected," they may be directly electrically connected, or layers, areas or elements may be indirectly electrically connected and an intervening portion may be present.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic plan view illustrating a display device 1 according to an embodiment.

Referring to FIG. 1, the display device 1 includes a display area DA displaying an image and a non-display area NDA that does not display an image. The display device 1 may provide an image to the outside by using light emitted from the display area DA.

The display device 1 includes a substrate 100. The substrate 100 may include glass or polymer resin. The substrate 100 including the polymer resin may have flexible, rollable, or bendable properties. The substrate 100 may have a multi-layer structure including a layer including the above-described polymer resin and an inorganic layer (not shown).

Although FIG. 1 shows an example in which the display area DA of the display device 1 has a rectangular shape, the disclosure according to the invention is not limited thereto. The display area DA may have a circular shape, an elliptical shape, or a polygonal shape, such as a triangular shape or a pentagonal shape in another embodiment. In addition, although FIG. 1 shows an example in which the display device 1 is a flat-panel display device, the display device 1 may be implemented in various forms such as a flexible, foldable, or rollable display device in another embodiment.

As the display device 1 according to the embodiment, an organic light-emitting display device will be described as an example. However, the display device 1 according to the invention is not limited thereto. In another embodiment, the display device 1 may be an inorganic light-emitting display device (or inorganic electroluminescence ("EL") display device) or a display device such as a quantum dot light-emitting display device. For example, an emission layer of a display element provided in the display device 1 may include an organic material, include an inorganic material, include a quantum dot, include an organic material and a quantum dot, include an inorganic material and a quantum dot, or include an organic material, an inorganic material, and a quantum dot.

Pixels PX including various display elements, such as an organic light-emitting diode, may be arranged in the display area DA of the substrate 100. A plurality of pixels PX is provided in the display area DA, and the plurality of pixels PX may be arranged in various forms, such as a stripe arrangement, a pentile arrangement, and a mosaic arrangement, to implement an image. Hereinafter, in the present specification, the pixels PX denote sub-pixels that emit different colors, and each of the pixels PX may be, for example, one of a red (R) sub-pixel, a green (G) sub-pixel, and a blue (B) sub-pixel. Furthermore, each pixel PX may further include elements such as a thin-film transistor ("TFT") and a capacitor.

The non-display area NDA is an area that does not provide an image, and may include a scan driver, a data driver, and the like, which provide electrical signals to be applied to the pixels PX of the display area DA, and also include power lines that deliver power such as a driving voltage and a common voltage.

Figure 2:
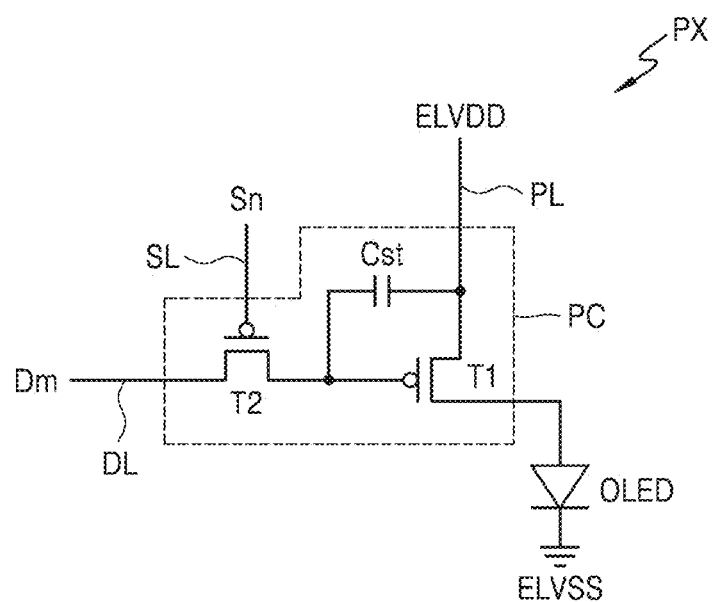
FIG. 2 is an equivalent circuit diagram of a pixel in a display device according to an embodiment.

FIG. 2 is an equivalent circuit diagram of a pixel PX in a display device according to an embodiment.

Referring to FIG. 2, each pixel PX includes a pixel circuit PC connected to a scan line SL and a data line DL, and an organic light-emitting diode OLED connected to the pixel circuit PC.

The pixel circuit PC includes a driving TFT T1, a switching TFT T2, and a storage capacitor Cst. The switching TFT T2 is connected to the scan line SL and the data line DL, and is configured to deliver, to the driving TFT T1, a data signal Dm input through the data line DL in response to a scan signal Sn input through the scan line SL.

The storage capacitor Cst is connected to the switching TFT T2 and a driving voltage line PL, and stores a voltage corresponding to a difference between a voltage received from the switching TFT T2 and a driving voltage ELVDD supplied to the driving voltage line PL.

The driving TFT T1 may be connected to the driving voltage line PL and the storage capacitor Cst, and may control a driving current flowing from the driving voltage line PL to the organic light-emitting diode OLED in accordance with a voltage value stored in the storage capacitor Cst. The organic light-emitting diode OLED may emit light according to the driving current, and the brightness of the light may be determined by the driving current Although FIG. 2 illustrates that the pixel circuit PC includes two TFTs and one storage capacitor, the present disclosure according to the invention is not limited thereto. For example, the pixel circuit PC may include three or more TFTs and/or two or more storage capacitors in another embodiment. In still another embodiment, the pixel circuit PC may include seven TFTs and one storage capacitor.

Figure 3:
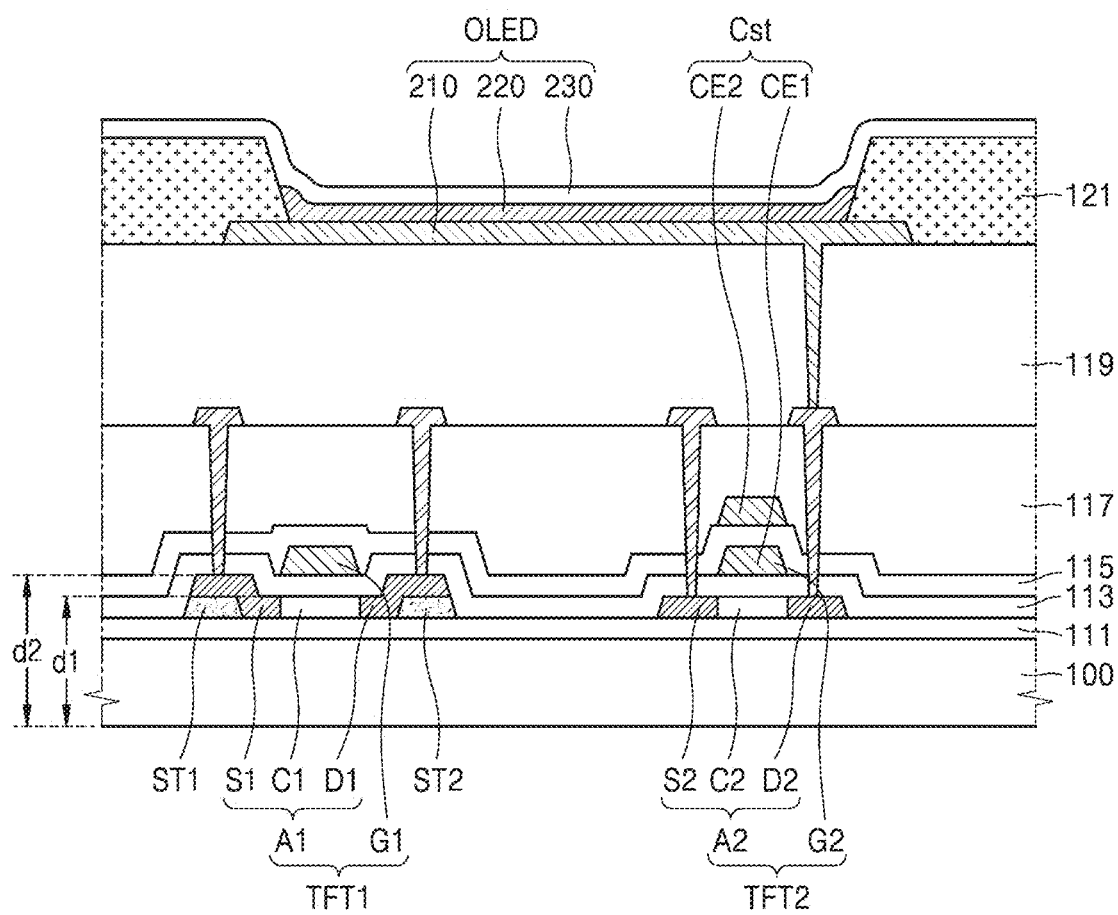
FIG. 3 is a schematic cross-sectional view illustrating a portion of a display device according to an embodiment.
Figure 4:
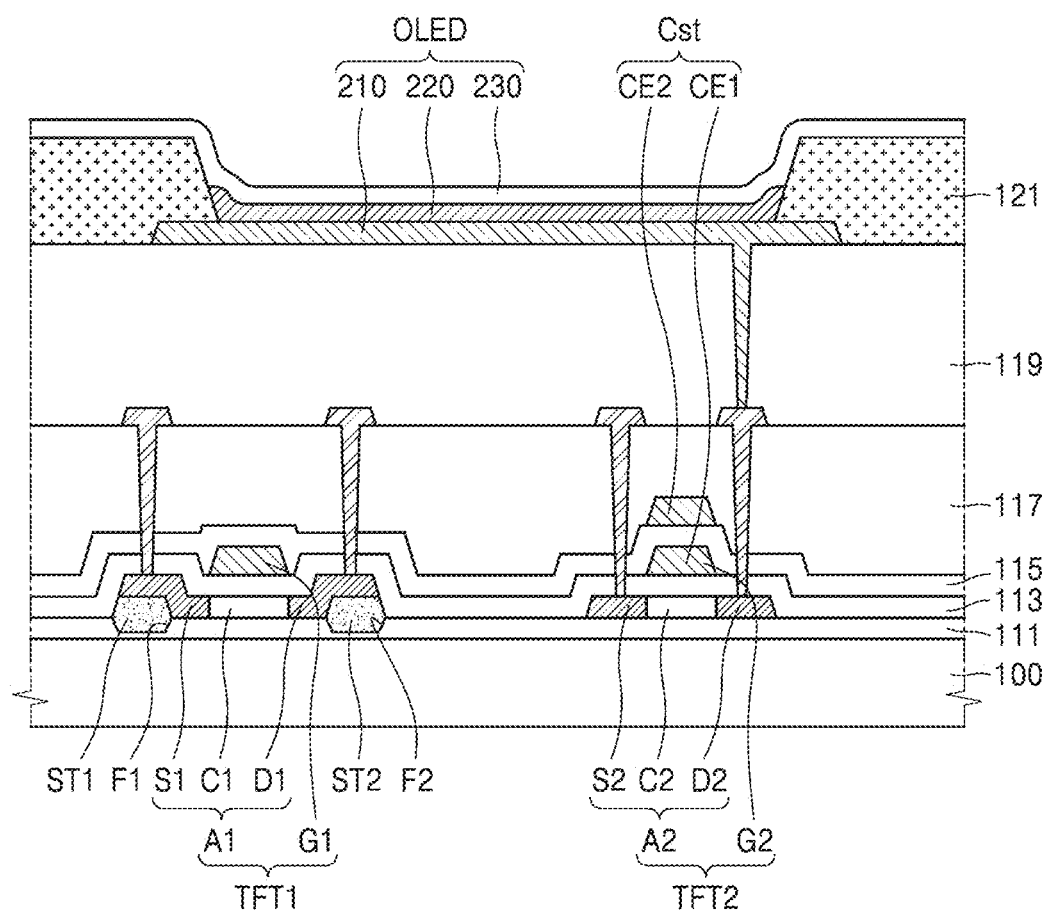
FIG. 4 is a schematic cross-sectional view illustrating a portion of a display device according to an embodiment.
Figure 5:
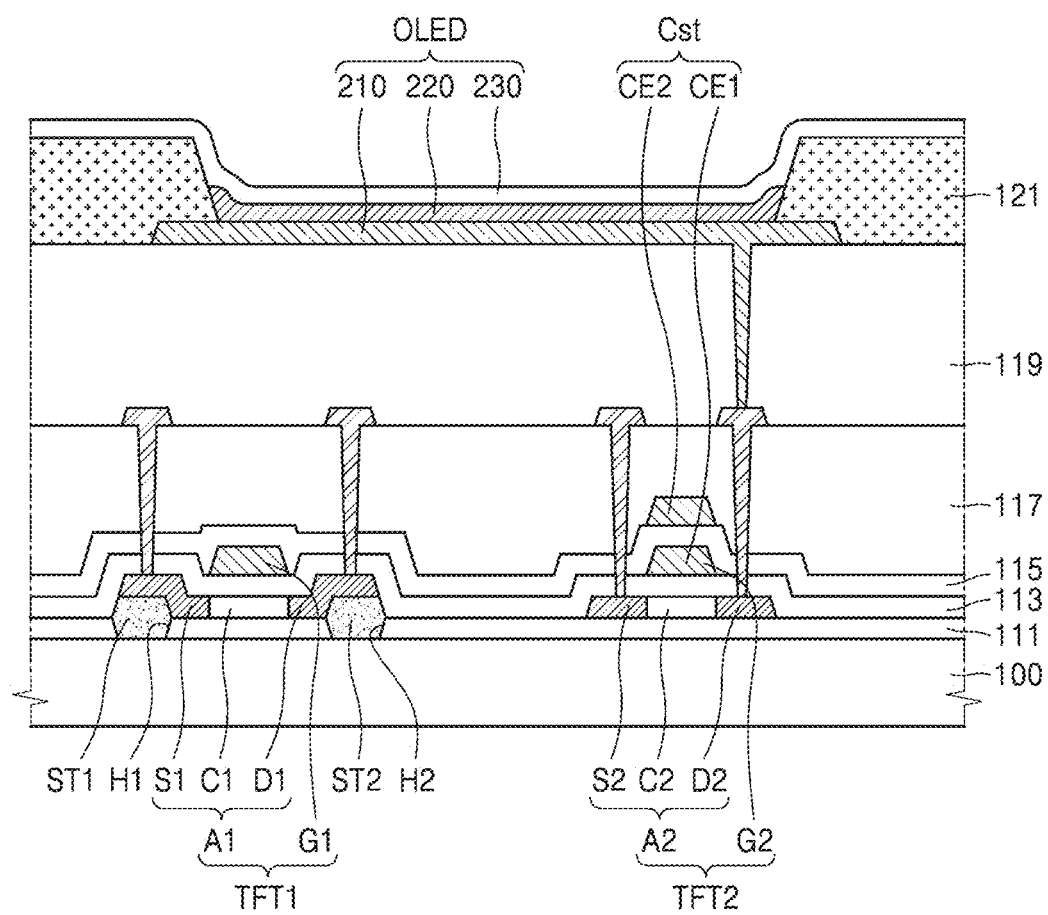
FIG. 5 is a schematic cross-sectional view illustrating a portion of a display device according to an embodiment.
Figure 6:
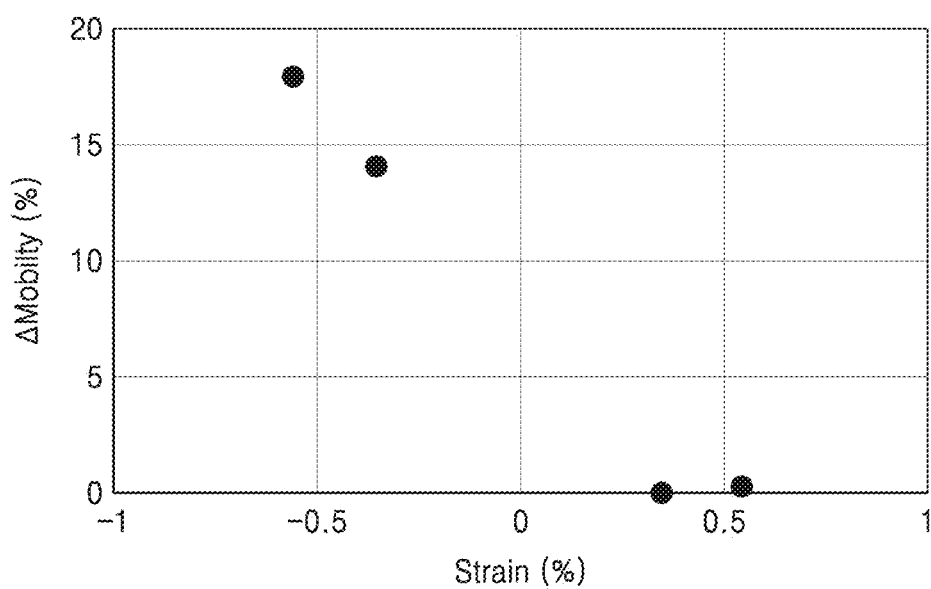
FIG. 6 is a graph showing a change in the mobility of holes, according to an embodiment.

FIGS. 3 to 5 are schematic cross-sectional views each illustrating a portion of a display device according to an embodiment, and FIG. 6 is a graph showing a change in the mobility of holes, according to an embodiment. FIGS. 4 and 5 correspond to embodiments partially modified from the embodiment of FIG. 3, and thus, description will be made based on FIG. 3. FIGS. 4 and 5 will be described mainly with respect to differences from FIG. 3.

Referring to FIG. 3, the display device 1 (refer to FIG. 1) includes a first TFT TFT1 arranged on a substrate 100, a storage capacitor Cst, and an organic light-emitting diode OLED that is a display element. The display device 1 may further include a second TFT TFT2.

In the present embodiment, the first TFT TFT1 may include a first semiconductor layer A1 and a gate electrode G1. The first semiconductor layer A1 includes a first channel region C1, a first source region S1, and a first drain region D1. In this case, a first stressor ST1 and a second stressor ST2 may be arranged under the first semiconductor layer A1. The first stressor ST1 may overlap at least a part of the first source region S1 in a plan view, and the second stressor ST2 may overlap at least a part of the first drain region D1 in the plan view.

Hereinafter, a configuration in the display device 1 will be described in more detail with reference to FIG. 3 according to a stacking order.

The substrate 100 may include glass or polymer resin. Examples of the polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, and the like. The substrate 100 including the polymer resin may have flexible, rollable, or bendable properties. The substrate 100 may have a multi-layer structure including a layer including the above-described polymer resin and an inorganic layer (not shown).

A buffer layer 111 may reduce or block the penetration of foreign matter, moisture, or external air from a lower portion of the substrate 100 and may provide a flat surface on the substrate 100. The buffer layer 111 may include an inorganic material, such as an oxide or a nitride, an organic material, or an organic-inorganic composite, and may have a single layer or multi-layer structure of an inorganic material and an organic material.

A barrier layer (not shown) may be further included between the substrate 100 and the buffer layer 111. The barrier layer may serve to prevent or reduce the penetration of impurities from the substrate 100 or the like into the first semiconductor layer A1 and the second semiconductor layer A2. The barrier layer may include an inorganic material, such as an oxide or a nitride, an organic material, or an organic-inorganic composite, and may have a single layer or multi-layer structure of an inorganic material and an organic material.

The first semiconductor layer A1 and the second semiconductor layer A2 may be arranged on the buffer layer 111. The first semiconductor layer A1 and the second semiconductor layer A2 may each include amorphous silicon or polysilicon. In another embodiment, the first semiconductor layer A1 and the second semiconductor layer A2 may each include an oxide of at least one selected from the group consisting of indium (In), gallium (Ga), stannum (Sn), zirconium (Zr), vanadium (V), hafnium (Hf), cadmium (Cd), germanium (Ge), chrome (Cr), titanium (Ti), aluminum (Al), cesium (Cs), cerium (Ce), and zinc (Zn).

The first semiconductor layer A1 may include the first channel region C1, and the first source region S1 and the first drain region D1 which are arranged on the opposite sides of the first channel region C1, respectively. The first semiconductor layer A1 may include a single layer or multiple layers. Although the first semiconductor layer A1 has been described as a reference layer, the same description applies to the second semiconductor layer A2. That is, the second semiconductor layer A2 may include a second channel region C2, and a second source region S2 and a second drain region D2 which are arranged on the opposite sides of the second channel region C2, respectively.

In an embodiment, the first stressor ST1 and the second stressor ST2 may be arranged between the substrate 100 and the first semiconductor layer A1.

The first stressor ST1 and the second stressor ST2 may be spaced apart from each other. The first stressor ST1 may overlap at least a part of the first source region S1 of the first semiconductor layer A1 in the plan view, and the second stressor ST2 may overlap at least a part of the first drain region D1 of the first semiconductor layer A1 in the plan view. Each of the first stressor ST1 and the second stressor ST2 may be patterned and may include an isolated pattern. That is, each of the first stressor ST1 and the second stressor ST2 may have an island shape.

As the first stressor ST1 is arranged under the first semiconductor layer A1, a distance d1 from the bottom surface of the substrate 100 to the top surface of the first channel region C1 in a thickness direction may be less than a distance d2 from the bottom surface of the substrate 100 to the top surface of the first source region S1 in the thickness direction. Here, the "thickness direction" refers to a direction perpendicular to a major surface (e.g., bottom surface) plane defining the substrate 100. In FIG. 3, the thickness direction corresponds to a vertical direction. In addition, as shown in FIG. 3, the distance d2 from the bottom surface of the substrate 100 to the top surface of the first source region S1 may be variable as the first stressor ST1 does not completely overlap the first source region S1, but overlaps only a part of the first source region S1. For example, the distance d2 from the bottom surface of the substrate 100 to the top surface of the first source region S1 may decrease along a direction toward to the first channel region C1. That is, the top surface of the first source region S1 may have a step. Although the first stressor ST1 and the first source region S1 have been described as references, the same applies to the second stressor ST2 and the first drain region D1.

In FIG. 3, the first stressor ST1 has a trapezoidal shape, but the first stressor ST1 may be in various shapes such as a circular shape, an ellipse shape, or a polygonal shape such as a triangle or a pentagon in another embodiment.

The distance between particles of a material in the first stressor ST1 and the distance between particles in a material in the second stressor ST2 each may be different from the distance between particles of a material in the first semiconductor layer A1. That is, the first stressor ST1 and the second stressor ST2 may include a material that is different from a material of the first semiconductor layer A1.

The first stressor ST1 and the second stressor ST2 may include silicon germanium (SiGe), silicon nitride ($SiN_x$), silicon carbon (SiC), boron oxide ($BO_x$) or the like. As another example, the first stressor ST1 and the second stressor ST2 may include a group III-V compound. The group III-V compound may be selected from among a two-element compound selected from the group consisting of GaN, GaP, GaAs, GaSb, AlN, AlP, AlAs, AlSb, InN, InP, InAs, InSb, and a mixture thereof; a three-element compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a four-element compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

A gate insulating layer 113 may be arranged on the substrate 100 to cover the first semiconductor layer A1 and the second semiconductor layer A2. The gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

The first gate electrode G1 may be arranged on the gate insulating layer 113 to overlap at least a part of the first semiconductor layer A1, and a second gate electrode G2 may be arranged on the gate insulating layer 113 to overlap at least a part of the second semiconductor layer A2.

In an embodiment, the storage capacitor Cst may include a first electrode CE1 and a second electrode CE2, and may overlap the second TFT TFT2, as shown in FIG. 3. For example, the second gate electrode G2 of the second TFT TFT2 may function as the first electrode CE1 of the storage capacitor Cst. Alternatively, the storage capacitor Cst may not overlap the second TFT TFT2 and may exist separately.

A first interlayer insulating layer 115 and a second interlayer insulating layer 117 may be stacked on the gate insulating layer 113. The first interlayer insulating layer 115 may cover the first electrode CE1 of the storage capacitor Cst, and the second interlayer insulating layer 117 may cover the second electrode CE2 of the storage capacitor Cst. The first interlayer insulating layer 115 and the second interlayer insulating layer 117 may include $SiO_2$, $SiN_x$, SiON, $Al_2O_3$, $TiO_2$, $Ta_2O_5$, $HfO_2$, $ZnO_2$, or the like.

The second electrode CE2 of the storage capacitor Cst overlaps the first electrode CE1 with the first interlayer insulating layer 115 therebetween, thereby forming a capacitance. In this case, the first interlayer insulating layer 115 may function as a dielectric layer of the storage capacitor Cst.

Source electrodes, drain electrodes, and a data line (not shown) may be arranged on the second interlayer insulating layer 117.

The source electrodes, the drain electrodes, and the data line may include a conductive material including molybdenum (Mo), aluminum (Al), copper (Cu), titanium (Ti), or the like and may each have a single layer or multi-layer structure including the above materials. For example, the source electrodes, the drain electrodes, and the data line may each include a multi-layer structure of Ti/Al/Ti. The source electrodes and the drain electrodes may be connected to the first source region S1 and the first drain region D1 of the first semiconductor layer A1 and the second source region S2 and the second drain region D2 of the second semiconductor layer A2 through contact holes.

The source electrodes and the drain electrodes may be covered with an inorganic protective layer (not shown). The inorganic protective layer may include a single layer or multiple layers including $SiN_x$ and $SiO_x$. The inorganic protective layer may be introduced to cover and protect some wirings arranged on the second interlayer insulating layer 117.

A planarization layer 119 may be arranged to cover the source and drain electrodes and may include a contact hole for connecting the second TFT TFT2 to a pixel electrode 210.

The planarization layer 119 may include a single layer or multiple layers including an organic material and may provide a flat top surface. The planarization layer 119 may include a general-purpose polymer (e.g., benzocyclobutene ("BOB"), polyimide, hexamethyldisiloxane ("HMDSO"), polymethylmethacrylate ("PMMA"), or polystyrene ("PS")), a polymer derivative having a phenolic group, an acryl-based polymer, an imide-based polymer, an aryl ether-based polymer, an amide-based polymer, a fluorine-based polymer, a p-xylene-based polymer, a vinyl alcohol-based polymer, or a blend thereof.

An organic light-emitting diode OLED may be arranged on the planarization layer 119. The organic light-emitting diode OLED includes a pixel electrode 210, an intermediate layer 220 including an organic emission layer, and an opposite electrode 230.

The pixel electrode 210 may be a (semi-)transmissive electrode or a reflective electrode. In some embodiments, the pixel electrode 210 may include a reflective layer including Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may include at least one selected from the group consisting of indium tin oxide ("ITO"), indium zinc oxide ("IZO"), zinc oxide ("ZnO"), indium oxide ($In_2O_3$), indium gallium oxide ("IGO"), and aluminum zinc oxide ("AZO"). In some embodiments, the pixel electrode 210 may include ITO/Ag/ITO.

In the display area DA of the substrate 100, a pixel-defining layer 121 may be arranged on the planarization layer 119. In addition, the pixel-defining layer 121 increases a distance between an edge of the pixel electrode 210 and the opposite electrode 230 on the pixel electrode 210 to prevent generation of arc at the edge of the pixel electrode 210.

The pixel-defining layer 121 may include one or more organic insulating materials selected from the group consisting of polyimide, polyamide, acryl resin, BOB, and phenol resin, and may be manufactured by a spin coating method, etc.

The intermediate layer 220 may be arranged in an opening defined by the pixel-defining layer 121 and may include an organic emission layer. The organic emission layer may include an organic material including a fluorescent or phosphorescent material that emits red, green, blue, or white light. The organic emission layer may include a low-molecular-weight organic material or a high-molecular-weight organic material, and under and above the organic emission layer, functional layers, such as a hole transport layer ("HTL"), a hole injection layer ("HIL"), an electron transport layer ("ETL"), and an electron injection layer ("EIL"), may be selectively further arranged.

The opposite electrode 230 may be a transmissive electrode or a reflective electrode. In some embodiments, the opposite electrode 230 may be a transparent or semi-transparent electrode and may include a metal thin film having a low work function, the metal thin film including Li, Ca, LiF/Ca, LiF/Al, Al, Ag, Mg, or a compound thereof. In addition, a transparent conductive oxide ("TCO") layer such as ITO, IZO, ZnO, or $In_2O_3$ may be further arranged on the metal thin film. The opposite electrode 230 may be arranged over the display area DA and may be arranged on the intermediate layer 220 and the pixel-defining layer 121. The opposite electrode 230 may be integrally formed with respect to a plurality of organic light-emitting diodes OLED to correspond to the plurality of pixel electrodes 210.

Because the organic light-emitting diodes OLED that are organic light-emitting devices may be easily damaged by moisture or oxygen from the outside, an encapsulation layer (not shown) may cover the organic light-emitting diodes OLED to protect the organic light-emitting diodes OLED. The encapsulation layer covers the display area DA and may extend to at least a portion of the non-display area NDA. The encapsulation layer may include a first inorganic encapsulation layer, an organic encapsulation layer, and a second inorganic encapsulation layer.

In the present embodiment, a first stressor ST1 and a second stressor ST2 may be arranged under the first semiconductor layer A1. The first stressor ST1 may overlap at least a part of the first source region S1, and the second stressor ST2 may overlap at least a part of the first drain region D1. This will be described in detail with reference to the configuration of FIG. 3 and data on a change in the mobility of holes according to the embodiment of FIG. 6.

The lattice size of the material in the first stressor ST1 arranged under the first semiconductor layer A1 may be different from the lattice size of the material in the first semiconductor layer A1. That is, the distance between particles of the material in the first stressor ST1 may be different from the distance between particles of the material in the first semiconductor layer A1. For example, the distance between particles of the material in the first stressor ST1 may be greater than the distance between particles of the material in the first semiconductor layer A1. In this case, the material in the first stressor ST1 may be SiGe or $SiN_x$, and the material in the first semiconductor layer A1 may be polysilicon. Although the first stressor ST1 has been described as an example, the same applies to the second stressor ST2.

The first stressor ST1 and the second stressor ST2 may each have film stress. The film stress refers to the magnitude of a force per unit area of a thin film layer, and compressive stress or tensile stress is a type of the film stress. The compressive stress is a force in a direction of pushing a thin film and may be a force in a direction in which the thin film is bent downward. On the other hand, the tensile stress is a force in a direction of pulling a thin film and may be a force in a direction in which the thin film is bent upward.

In an embodiment, when the first semiconductor layer A1 is a p-type semiconductor layer, the first stressor ST1 may have compressive stress. In this case, the distance between particles of the material in the first stressor ST1 may be greater than the distance between particles of the material in the first semiconductor layer A1. As another example, when the first semiconductor layer A1 is an n-type semiconductor layer, the first stressor ST1 may have tensile stress. In this case, the distance between particles of the material in the first stressor ST1 may be less than the distance between particles of the material in the first semiconductor layer A1. In this case, the material in the first stressor ST1 may be SiC or $BO_x$. Although the first stressor ST1 has been described as an example, the same applies to the second stressor ST2.

Referring to FIG. 6, when a semiconductor layer is deformed by compressing or tensioning the semiconductor layer, a change in hole mobility according to strain of the semiconductor layer may occur. FIG. 6 shows a case where the semiconductor layer is a p-type semiconductor layer.

In FIG. 6, when the strain of the semiconductor layer is negative, the length of the semiconductor layer is reduced by compression of the semiconductor layer. Conversely, when the strain of the semiconductor layer is a positive value, the length of the semiconductor layer increases by tensioning of the semiconductor layer. The length of the semiconductor layer may be measured in a direction parallel to the major surface plane defining the substrate 100 (i.e., a direction perpendicular to the thickness direction). It may be seen that when the strain of the semiconductor layer is about −0.5%, the mobility of holes in the semiconductor layer increases by about 14% to about 19%. Alternatively, it may be seen that when the strain of the semiconductor layer is about +0.5%, the mobility of holes in the semiconductor layer does not change.

When the semiconductor layer is a p-type semiconductor layer, the majority carriers of the p-type semiconductor layer are holes. In this case, when the strain of the semiconductor layer has a negative value, that is, when the semiconductor layer is compressed, the gap between particles in the semiconductor layer is narrowed. For example, the gap between polysilicons in the semiconductor layer is narrowed, and the movement of holes is facilitated. Therefore, when the semiconductor layer is a p-type semiconductor layer, compression of the semiconductor layer increases the mobility of holes in the semiconductor layer. It may be seen that this is consistent with the data in FIG. 6.

In FIG. 6, the case where the semiconductor layer is a p-type semiconductor layer is illustrated as an example, but the same description also applies to the case where the semiconductor layer is an n-type semiconductor layer. When the semiconductor layer is an n-type semiconductor layer, the majority carriers are electrons, and the mobility of electrons in the semiconductor layer increases when the semiconductor layer is tensioned. This is opposite to the case where the semiconductor layer is a p-type semiconductor layer. When the strain of the semiconductor layer is positive, that is, when the semiconductor layer is tensioned, the gap between particles in the semiconductor layer is widened. For example, the gap between polysilicons in the semiconductor layer is widened, and the movement of electrons is facilitated. Therefore, when the semiconductor layer is an n-type semiconductor layer, the tension of the semiconductor layer increases the mobility of electrons in the semiconductor layer.

According to an embodiment, a first stressor ST1 and a second stressor ST2 may be arranged under the first semiconductor layer A1. The first stressor ST1 may overlap at least a part of the first source region S1, and the second stressor ST2 may overlap at least a part of the first drain region D1. In this case, due to the first stressor ST1, the distance d2 from the bottom surface of the substrate 100 to the top surface of the first source region S1 may be greater than the distance d1 from the bottom surface of the substrate 100 to the top surface of the first channel region C1 in the thickness direction, and thus, a physical force may be applied from the first source region S1 to the first channel region C1. Similarly, due to the second stressor ST2, the distance from the bottom surface of the substrate 100 to the top surface of the first drain region D1 may be greater than the distance d1 from the bottom surface of the substrate 100 to the top surface of the first channel region C1, and thus, a physical force may be applied from the first drain region D1 to the first channel region C1. That is, as the first and second stressors ST1 and ST2 are arranged under the first semiconductor layer A1, the first channel region C1 may be compressed due to structural characteristics. Accordingly, as shown in FIG. 6, as the first channel region C1 is compressed, the mobility of holes in the first semiconductor layer A1 increases. The pulse width of a scan signal may be reduced through the first TFT TFT1 including the first semiconductor layer A1 having increased hole mobility, and a driving frequency may be increased, thereby enabling high-speed driving.

In addition, the first stressor ST1 may have compressive film stress, and this case corresponds to the case where the distance between particles of the material in the first stressor ST1 is greater than the distance between particles of the material in the first semiconductor layer A1. In other words, the lattice size of the material in the first stressor ST1 may be greater than the lattice size of the material in the first semiconductor layer A1. That is, the crystal size of the material in the first stressor ST1 may be greater than the crystal size of the material in the first semiconductor layer A1. For example, the first stressor ST1 may include SiGe, and the first semiconductor layer A1 may include polysilicon. The lattice size of SiGe is greater than that of polysilicon.

In this case, SiGe and polysilicon, which have different lattice sizes, meet at the interface between an upper portion of the first stressor ST1 and the first semiconductor layer A1 formed thereon, and polysilicon with a smaller lattice size than SiGe is stretched to match the lattice size of SiGe. That is, the lattice size of polysilicon may be changed by the surrounding lattice of a different material. Because the first stressor ST1 is arranged to overlap at least a part of the first source region S1, the lattice size of polysilicon increases on the surface of the first source region S1 in contact with the first stressor ST1 according to the above-described principle. As the lattice size of polysilicon increases in a portion of the first source region S1 adjacent to the first stressor ST1, a portion of the first source region S1 adjacent to the first channel region C1 is compressed. Although the first stressor ST1 has been described as an example, the same applies to the second stressor ST2.

That is, as the distance between particles of the material in the first stressor ST1 and the distance between particles of the material in the second stressor ST2 each are different from the distance between particles of the material in the first semiconductor layer A1, the first channel region C1 may be compressed. Therefore, the first channel region C1 may be further compressed, and the mobility of holes in the first semiconductor layer A1 may further increase. As the hole mobility increases, the pulse width of the scan signal may be reduced, and because the driving frequency may increase, high-speed driving is possible.

In an embodiment, the first stressor ST1 and the second stressor ST2 may be arranged only under the first semiconductor layer A1 of the first TFT TFT1 selected from the first TFT TFT1 and the second TFT TFT2. When the pixel circuit PC (see FIG. 2) includes two TFTs and one storage capacitor, the first TFT TFT1 may be a switching TFT T2 (see FIG. 2), and the second TFT TFT2 may be a driving TFT T1 (see FIG. 2). As another example, when the pixel circuit PC includes seven TFTs and one storage capacitor, the first TFT TFT1 may correspond to the remaining TFTs except for the driving TFT T1. That is, the first stressor ST1 and the second stressor ST2 may be arranged selectively under semiconductor layers of the remaining TFTs except for the driving TFT T1. Through this, it is possible to improve the on/off characteristics of the switching TFT T2 while maintaining an output current value relative to an input voltage of the driving TFT T1. That is, high-speed driving is possible while maintaining the luminance of the organic light-emitting diode OLED.

As a comparative example, some of the TFTs may be selected, and a stressor may not be arranged under the selected TFTs. That is, a stressor may be arranged on the entire surface of a substrate without being patterned. The stressor arranged on the entire surface of the substrate may have compressive stress or tensile stress. When the stressor has compressive stress, a force may be applied to the entire surface of the substrate, and the entire panel including the substrate may be concavely bent.

However, as in the embodiment, when the first and second stressors ST1 and ST2 are arranged selectively under the semiconductor layers of the remaining TFTs except for the driving TFT T1, the substrate 100 is partially subjected to compressive stress or tensile stress because the first stressor ST1 and the second stressor ST2 are not arranged on the entire surface of the substrate 100. Therefore, the entire panel including the substrate 100 is not bent. In addition, the pulse width of the scan signal may be reduced through the first TFT TFT1 in which the hole mobility increases by compression of the first channel region C1, and a driving frequency may be increased, thereby enabling high-speed driving. When the first TFT TFT1 is the switching TFT T2, on/off characteristics are improved, and high-speed driving is possible.

In an embodiment, as shown in FIG. 4, the buffer layer 111 may define a first groove F1 and a second groove F2, and a portion of the first stressor ST1 may be buried in the first groove F1, and a portion of the second stressor ST2 may be buried in the second groove F2.

In another embodiment, as shown in FIG. 5, the buffer layer 111 may define a first through-hole H1 and a second through-hole H2, and a portion of the first stressor ST1 may be buried in the first through-hole H1 and a portion of the second stressor ST2 may be buried in the second through-hole H2.

When the buffer layer 111 define a groove or a through-hole, the thicknesses of the first and second stressors ST1 and ST2 in the thickness direction may be adjusted, and accordingly, the volumes of the first and second stressors ST1 and ST2 may be adjusted. When the buffer layer 111 does not define a groove or a through-hole (see FIG. 3), the first and second stressors ST1 and ST2 are relatively thin, and the volumes of the first and second stressors ST1 and ST2 are relatively small. Alternatively, when the buffer layer 111 define a through-hole (see FIG. 5), the first and second stressors ST1 and ST2 are relatively thick, and the volumes of the first and second stressors ST1 and ST2 are relatively large.

Because the first stressor ST1 and the second stressor ST2 have compressive stress or tensile stress, the magnitude of the compressive stress or the tensile stress may be adjusted depending on the thicknesses of the first stressor ST1 and the second stressor ST2. For example, when the buffer layer 111 defines a first through-hole H1 and a second through-hole H2, a portion of the first stressor ST1 is buried in the first through-hole H1, and a portion of the second stressor ST2 is buried in the second through-hole H2, the thicknesses of the first and second stressors ST1 and S2 in the thickness direction may be the thickest among the aforementioned embodiments and the magnitude of the compressive stress or the tensile stress may also be greatest among the aforementioned embodiments.

Figure 7A:
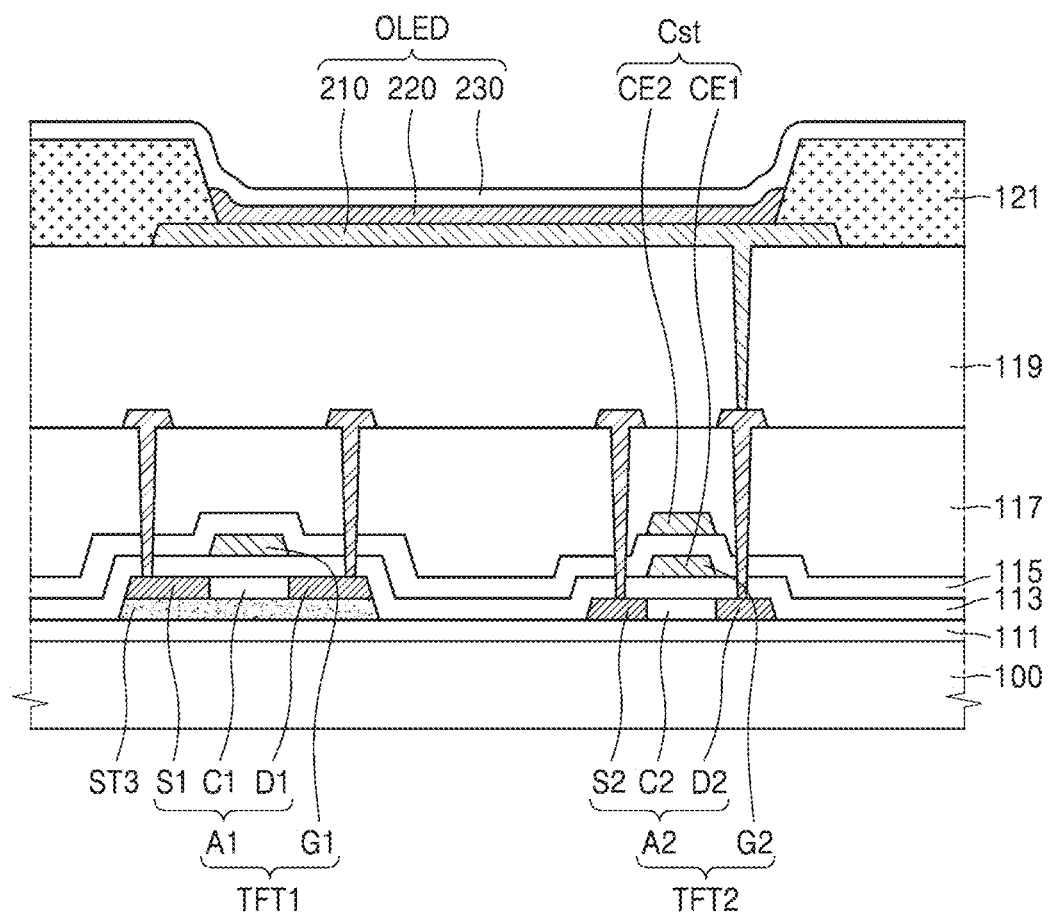
FIGS. 7A and 7B are schematic cross-sectional views illustrating a portion of a display device according to an embodiment.
Figure 7B:
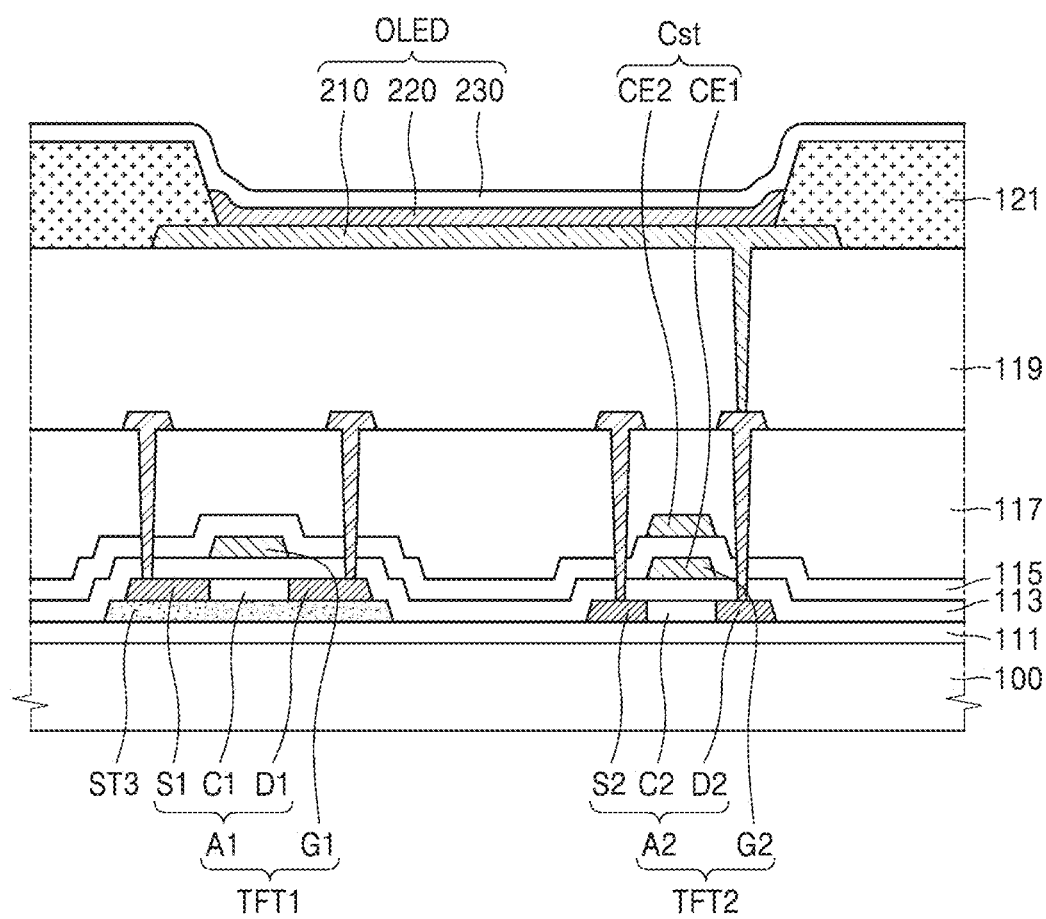
Figure 8:
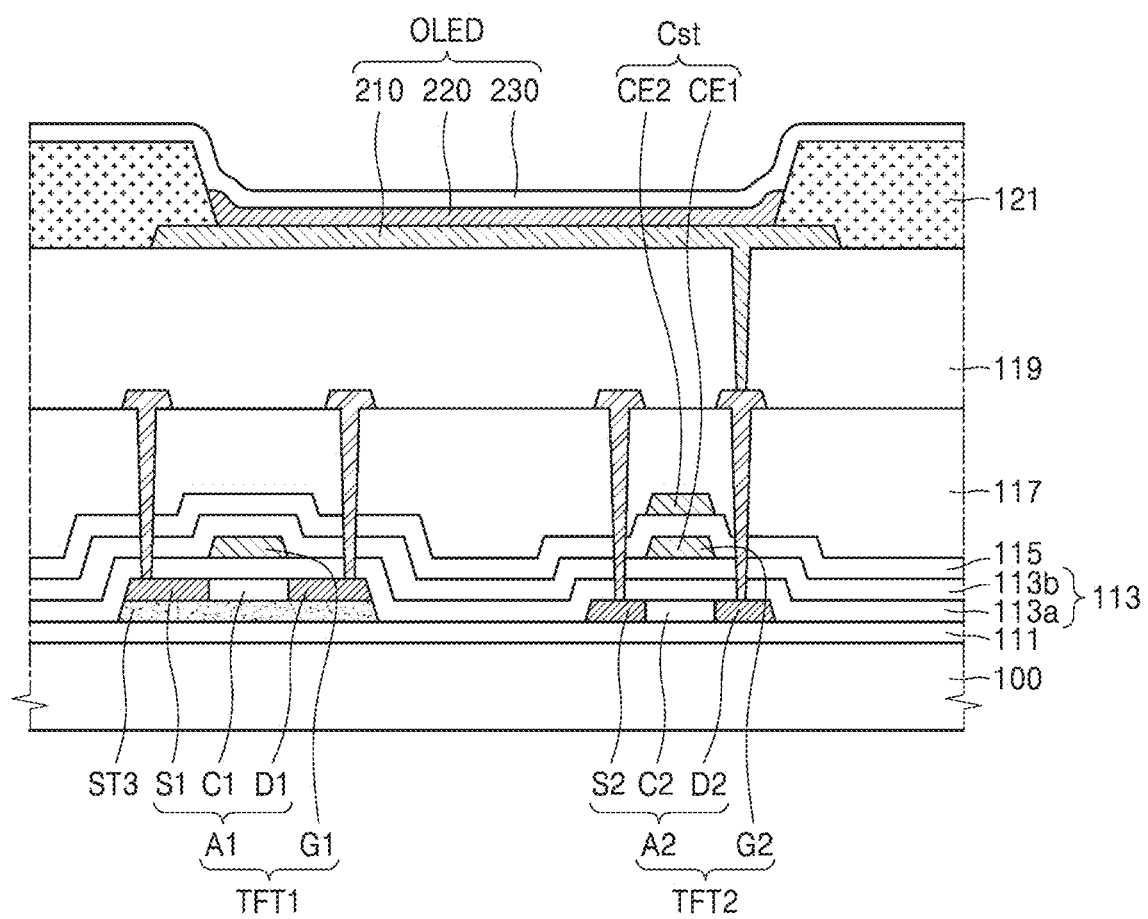
FIG. 8 is a schematic cross-sectional view illustrating a portion of a display device according to an embodiment.

FIGS. 7A and 7B are schematic cross-sectional views illustrating a portion of a display device according to an embodiment, and FIG. 8 is a schematic cross-sectional view illustrating a portion of a display device according to an embodiment. In FIGS. 7A, 7B, and 8, the same reference numerals as those in FIG. 3 denote the same members as those in FIG. 3, and repeated descriptions thereof will be omitted.

Referring to FIG. 7A, the display device includes a first TFT TFT1 arranged on a substrate 100, a storage capacitor Cst, and an organic light-emitting diode OLED that is a display element. In this case, a third stressor ST3 may be arranged under a first semiconductor layer A1 of the first TFT TFT1 to at least partially overlap the first semiconductor layer A1.

The third stressor ST3 may include SiGe, $SiN_x$, SiC, $BO_x$, a group III-V compound, or the like. The third stressor ST3 may be patterned and may include an isolated pattern. That is, the third stressor ST3 may have an island shape.

The first TFT TFT1 may be one of the remaining TFTs except for the driving TFT T1 (see FIG. 2). For example, the first TFT TFT1 may be the switching TFT T2 (see FIG. 2).

In FIG. 3, the first and second stressors ST1 and ST2 spaced apart from each other are arranged under the first semiconductor layer A1. However, in FIG. 7A, the third stressor ST3 may be arranged to overlap the first channel region C1, the first source region S1, and the first drain region D1 of the first semiconductor layer A1. In this case, the distance between particles of the material in the first semiconductor layer A1 and the distance between particles of the material in the third stressor ST3 may be different from each other.

In an embodiment, the third stressor ST3 may have compressive or tensile film stress. For example, when the first semiconductor layer A1 is a p-type semiconductor layer, the third stressor ST3 may have compressive stress. In this case, the distance between particles of the material in the third stressor ST3 may be greater than the distance between particles of the material in the first semiconductor layer A1. In this case, the material in the third stressor ST3 may be SiGe or $SiN_x$, and the material in the first semiconductor layer A1 may be polysilicon. As another example, when the first semiconductor layer A1 is an n-type semiconductor layer, the third stressor ST3 may have tensile stress. In this case, the distance between particles of the material in the third stressor ST3 may be less than the distance between particles of the material in the first semiconductor layer A1. In this case, the material in the third stressor ST3 may be SiC or $BO_x$.

When the distance between particles of the material in the third stressor ST3 is greater than the distance between particles of the material in the first semiconductor layer A1, the particles having different lattice sizes meet at the interface between an upper portion of the third stressor ST3 and the first semiconductor layer A1 formed thereon, the material in the first semiconductor layer A1 is stretched to match the lattice size of the material in the third stressor ST3. That is, the lattice size of the material in the first semiconductor layer A1 may be changed by the surrounding lattice of a different material. As the lattice size of the material in the first semiconductor layer A1 partially increases, compressive stress may be transmitted to the first channel region C1. As the first channel region C1 is compressed, the mobility of holes in the first semiconductor layer A1 increases, and high-speed driving is possible. When the first TFT TFT1 is the switching TFT T2, on/off characteristics may be improved, and thus high-speed driving is possible.

Conversely, when the distance between particles of the material in the third stressor ST3 is less than the distance between particles of the material in the first semiconductor layer A1, the particles having different lattice sizes meet at the interface between an upper portion of the third stressor ST3 and the first semiconductor layer A1 formed thereon, and the material in the first semiconductor layer A1 is compressed to match the lattice size of the material in the third stressor ST3. As the lattice size of the material in the first semiconductor layer A1 is partially reduced, tensile stress may be transmitted to the first channel region C1. As the first channel region C1 is tensioned, the mobility of electrons in the first semiconductor layer A1 increases, and high-speed driving is possible.

In FIG. 7A, the side surface of the third stressor ST3 coincides with the side surface of the first semiconductor layer A1. However, in FIG. 7B, the side surface of the third stressor ST3 may not coincide with the side surface of the first semiconductor layer A1. That is, the length of the upper surface of the third stressor ST3 in a direction parallel to the major surface plane defining the substrate 100 may be greater than the length of the lower surface of the first semiconductor layer A1. The third stressor ST3 and the first semiconductor layer A1 may be formed by being patterned.

Referring to FIG. 8, a gate insulating layer 113 may include a first gate insulating layer 113a and a second gate insulating layer 113b, and a first gate electrode G1 may be arranged on the first gate insulating layer 113a and a second gate electrode G2 may be arranged on the second gate insulating layer 113b. In this case, the first TFT TFT1 may be the switching TFT T2, and the second TFT TFT2 may be the driving TFT T1.

In this case, the capacitance between the second gate electrode G2 and the second semiconductor layer A2 may be adjusted through the second gate insulating layer 113b. That is, the capacitance between the second gate electrode G2 and the second semiconductor layer A2 may vary according to the thickness of the second gate insulating layer 113b. Accordingly, a threshold voltage of the second TFT TFT2, which is the driving TFT T1, may be adjusted by adjusting the capacitance between the second gate electrode G2 and the second semiconductor layer A2. For example, as the capacitance between the second gate electrode G2 and the second semiconductor layer A2 increases, the threshold voltage of the second TFT TFT2 may decrease. As described above, a deviation of an output current value corresponding to an input voltage may be reduced by adjusting the threshold voltage of the second TFT TFT2, and the output current value of the second TFT TFT2 may be constant. When the output current value is constant, a difference in luminance between pixels in the panel may decrease, and the unevenness of the panel due to the difference in luminance may be reduced.

Figure 9:
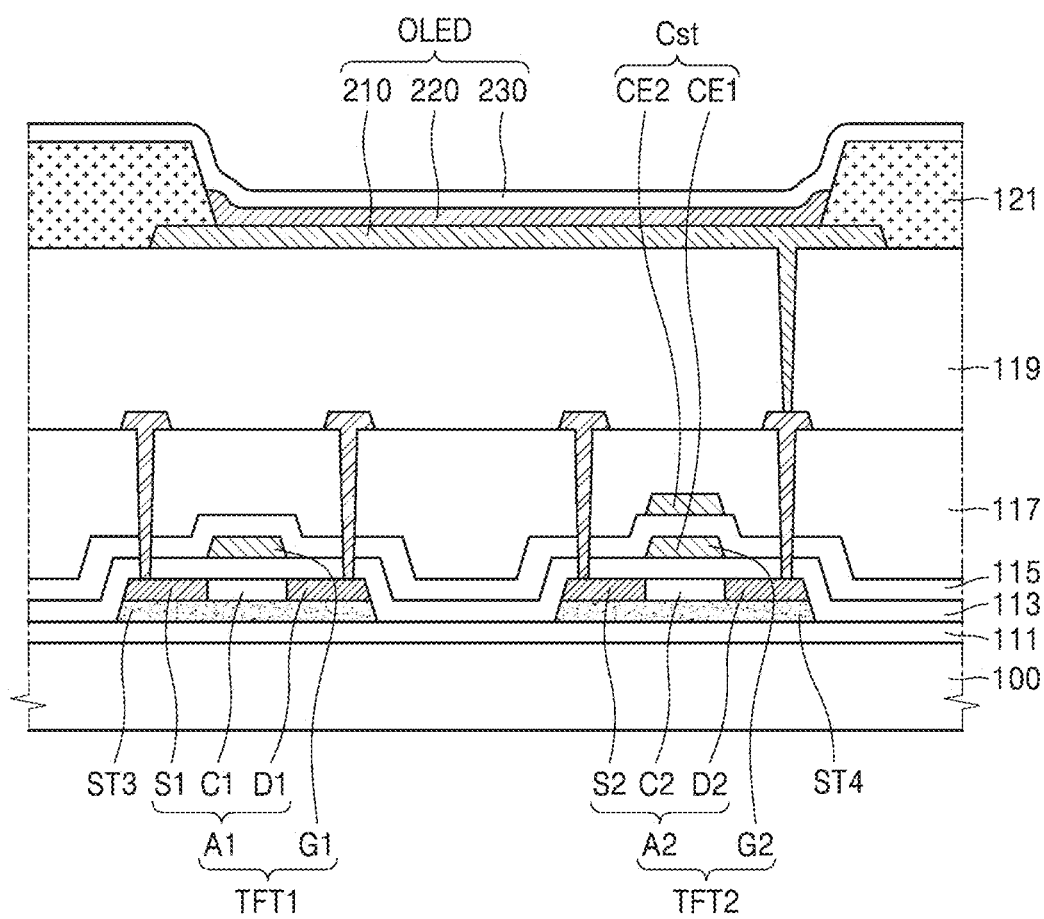
FIG. 9 is a schematic cross-sectional view illustrating a portion of a display device according to an embodiment.
Figure 10:
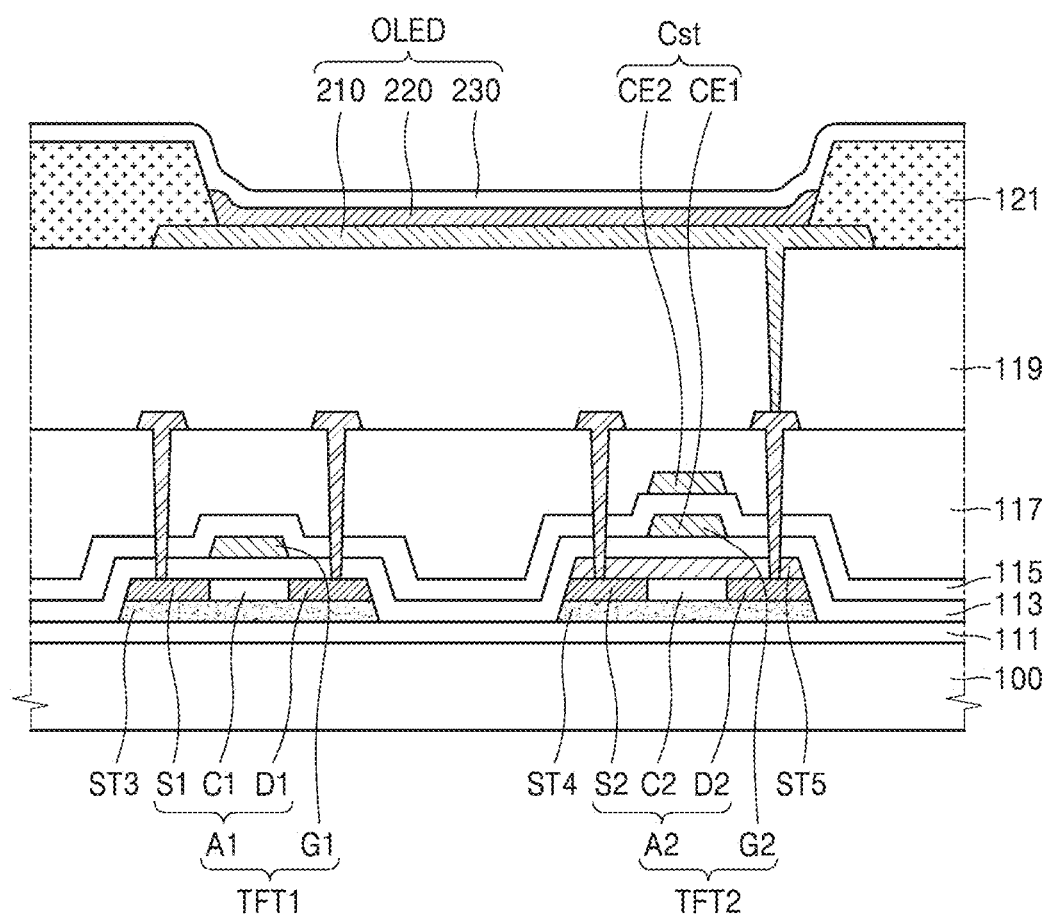
FIG. 10 is a schematic cross-sectional view illustrating a portion of a display device according to an embodiment.
Figure 11:
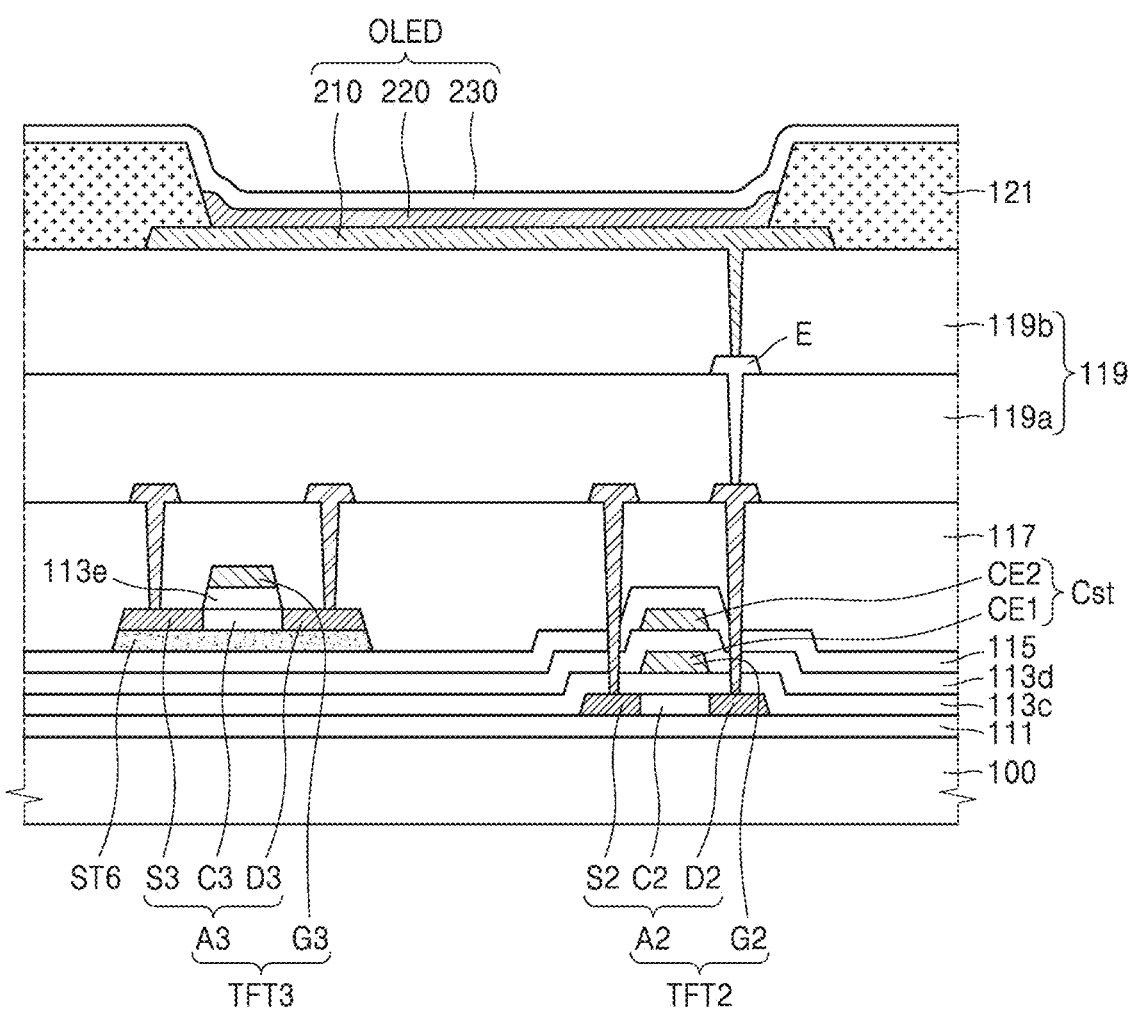
FIG. 11 is a schematic cross-sectional view illustrating a portion of a display device according to an embodiment.

FIGS. 9 to 11 are schematic cross-sectional views each illustrating a portion of a display device according to an embodiment. In FIGS. 9 to 11, the same reference numerals as those in FIG. 3 denote the same members as those in FIG. 3, and repeated descriptions thereof will be omitted.

Referring to FIG. 9, the display device includes a first TFT TFT1 and a second TFT TFT2, which are arranged on a substrate 100. In this case, a third stressor ST3 may be arranged under a first semiconductor layer A1 of the first TFT TFT1 to overlap the first semiconductor layer A1, and a fourth stressor ST4 may be arranged under a second semiconductor layer A2 of the second TFT TFT2 to overlap the second semiconductor layer A2 in the plan view. In addition, the distance between particles of the material in the second semiconductor layer A2 and the distance between particles of the material in the fourth stressor ST4 may be different from each other.

The third stressor ST3 and the fourth stressor ST4 may include SiGe, $SiN_x$, SiC, $BO_x$, a group III-V compound, or the like. Each of the third stressor ST3 and the fourth stressor ST4 may be patterned and may include an isolated pattern.

As described above, when the third stressor ST3 and the fourth stressor ST4 are arranged under the first semiconductor layer A1 and the second semiconductor layer A2, respectively, the distance from the bottom surface of the substrate 100 to the top surface of the first semiconductor layer A1 is equal to the distance from the bottom surface of the substrate 100 to the top surface of the second semiconductor layer A2. That is, the first semiconductor layer A1 and the second semiconductor layer A2 are flat. A crystallized silicon may be uniformly formed when a process (e.g., excimer laser annealing ("ELA")) of crystallizing amorphous silicon in the first semiconductor layer A1 and the second semiconductor layer A2 is performed. That is, ELA crystal structure characteristics become uniform.

In FIG. 9, the side surface of the fourth stressor ST4 coincides with the side surface of the second semiconductor layer A2. However, as shown in FIG. 7B, the side surface of the fourth stressor ST4 may not coincide with the side surface of the second semiconductor layer A2. That is, the length of the upper surface of the fourth stressor ST4 in a direction parallel to the major surface plane defining the substrate 100 may be greater than the length of the lower surface of the second semiconductor layer A2.

Referring to FIG. 10, the third stressor ST3 may be arranged under the first semiconductor layer A1 of the first TFT TFT1, and the fourth stressor ST4 may be arranged under the second semiconductor layer A2 of the second TFT TFT2. In addition, a fifth stressor ST5 may be arranged on the second semiconductor layer A2 to overlap the second semiconductor layer A2 in the plan view. In this case, the fourth stressor ST4 and the fifth stressor ST5 may have different types of film stress. For example, the fourth stressor ST4 may have compressive film stress, and the fifth stressor ST5 may have tensile film stress. As another example, the fourth stressor ST4 may have tensile film stress, and the fifth stressor ST5 may have compressive film stress. In this case, the flatness of the first semiconductor layer A1 and the second semiconductor layer A2 may be maintained, and when the first TFT TFT1 is the switching TFT T2, on/off characteristics may be improved, and accordingly, high-speed driving is possible. In addition, the second semiconductor layer A2 may be in an equilibrium state as the fourth stressor ST4 and the fifth stressor ST5 have different types of film stress, and an output current value relative to an input voltage of the second TFT TFT2 including the second semiconductor layer A2 may be maintained. That is, high-speed driving is possible while maintaining the luminance of the organic light-emitting diode OLED.

Referring to FIG. 11, a buffer layer 111 may be arranged on the substrate 100, and the second semiconductor layer A2 may be arranged on the buffer layer 111. The second semiconductor layer A2 may include amorphous silicon or polysilicon. A third gate insulating layer 113c may be arranged on the second semiconductor layer A2, and a second gate electrode G2 may be arranged on the third gate insulating layer 113c to overlap at least a part of the second semiconductor layer A2 in a plan view.

In an embodiment, the storage capacitor Cst may include a first electrode CE1 and a second electrode CE2, and may overlap the second TFT TFT2, as shown in FIG. 11. For example, the second gate electrode G2 of the second TFT TFT2 may function as the first electrode CE1 of the storage capacitor Cst. Alternatively, the storage capacitor Cst may not overlap the second TFT TFT2 in the plan view and may exist separately.

A fourth gate insulating layer 113d is arranged on the third gate insulating layer 113c to cover the first electrode CE1 of the storage capacitor Cst, and the second electrode CE2 of the storage capacitor Cst overlaps the first electrode CE1 with the fourth gate insulating layer 113d therebetween, thereby forming a capacitance. In this case, the fourth gate insulating layer 113d may function as a dielectric layer of the storage capacitor Cst.

A first interlayer insulating layer 115 may be arranged on the fourth gate insulating layer 113d to cover the second electrode CE2 of the storage capacitor Cst, and a third semiconductor layer A3 may be arranged on the first interlayer insulating layer 115. The third semiconductor layer A3 may include an oxide of at least one selected from the group consisting of In, Ga, Sn, Zr, V, Hf, Cd, Ge, Cr, Ti, Al, Cs, Ce, and Zn.

In an embodiment, a sixth stressor ST6 may be arranged to overlap the third semiconductor layer A3 between the first interlayer insulating layer 115 and the third semiconductor layer A3.

The sixth stressor ST6 may include SiGe, $SiN_x$, SiC, $BO_x$, a group III-V compound, or the like. The sixth stressor ST6 may be patterned and may include an isolated pattern.

In FIG. 3, the first and second stressors ST1 and ST2 spaced apart from each other are arranged under the first semiconductor layer A1. However, in FIG. 11, the sixth stressor ST6 may be arranged to overlap a third channel region C3, a third source region S3, and a third drain region D3 of the third semiconductor layer A3 in the plan view. In this case, the distance between particles of the material in the third semiconductor layer A3 and the distance between particles of the material in the sixth stressor ST6 may be different from each other.

A fifth gate insulating layer 113e may be arranged on the third semiconductor layer A3, and a third gate electrode G3 may be arranged on the fifth gate insulating layer 113e to overlap at least a part of the third semiconductor layer A3.

As shown in FIG. 11, the fifth gate insulating layer 113e may be patterned to overlap a portion of the third semiconductor layer A3 in the plan view. That is, the fifth gate insulating layer 113e may be patterned to expose the third source region S3 and the third drain region D3, and each of the side surface of the fifth gate insulating layer 113e and the side surface of the third gate electrode G3 may be an etching surface of the same surface.

A region where the fifth gate insulating layer 113e and the third semiconductor layer A3 overlap each other may be understood as the third channel region C3. The third source region S3 and the third drain region D3 undergo a conductorization process by plasma treatment, etc. In this case, a portion (i.e., the third channel region C3) of the third semiconductor layer A3, which overlaps the fifth gate insulating layer 113e, does not undergo a plasma treatment and thus has different properties from the third source region S3 and the third drain region D3. That is, by using the third gate electrode G3, which is located on the fifth gate insulating layer 113e, as a self align mask when plasma processing the third semiconductor layer A3, the third channel region C3, which is not plasma-processed, may be formed at a position overlapping the fifth gate insulating layer 113e, and the third source region S3 and the third drain region D3, which are plasma-processed, may be respectively formed on both sides of the third channel region C3.

In another embodiment, the fifth gate insulating layer 113e may not be patterned to overlap a portion of the third semiconductor layer A3, but may be arranged on the entire surface of the substrate 100 to cover the third semiconductor layer A3.

A second interlayer insulating layer 117 may be arranged on the third gate electrode G3, and source electrodes, drain electrodes, and a data line (not shown) may be arranged on the second interlayer insulating layer 117. A planarization layer 119 may be arranged to cover the source and drain electrodes and may define a contact hole for connecting the second TFT TFT2 to a pixel electrode 210.

The planarization layer 119 may include a first planarization layer 119a and a second planarization layer 119b. The second TFT TFT2 and the pixel electrode 210 may be connected to each other through an electrode layer E arranged on the first planarization layer 119a. In another example, the second planarization layer 119b may be omitted, and the second TFT TFT2 and the pixel electrode 210 may be directly connected to each other without passing through the electrode layer E.

In an embodiment, the sixth stressor ST6 may have a compressive or tensile film stress. For example, when the third semiconductor layer A3 is an n-type semiconductor layer, the sixth stressor ST6 may have a tensile stress. In this case, the distance between particles of the material in the sixth stressor ST6 may be less than the distance between particles of the material in the third semiconductor layer A3. In this case, the material in the sixth stressor ST6 may be SiC or $BO_x$. When the distance between particles of the material in the sixth stressor ST6 is less than the distance between particles of the material in the third semiconductor layer A3, particles having different lattice sizes meet at the interface between an upper portion of the sixth stressor ST6 and the third semiconductor layer A3 formed thereon, and the material in the third semiconductor layer A3 is reduced to match the lattice size of the material in the sixth stressor ST6. As the lattice size of the material in the third semiconductor layer A3 is partially reduced, a tensile stress may be transmitted to the third channel region C3. As the third channel region C3 is tensioned, the mobility of electrons in the third semiconductor layer A3 increases, and high-speed driving is possible.

According to one or more embodiments of the disclosure, the mobility of electrons or holes in a TFT may increase to thereby realize a display device capable of high-speed driving. However, the scope of the disclosure is not limited by the above effects.

So far, only the display device has been mainly described, but the disclosure is not limited thereto. For example, it will be understood that a method of manufacturing the display device also falls within the scope of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a first semiconductor layer arranged on a substrate and including a first channel region, a first source region, and a first drain region;
   a first stressor arranged between the substrate and the first semiconductor layer and which is overlapped by the first source region in a thickness direction of the first semiconductor layer;
   a second stressor arranged between the substrate and the first semiconductor layer and which is overlapped by the first drain region in the thickness direction, the second stressor being spaced apart from the first stressor;
   a gate insulating layer arranged on the first semiconductor layer;
   a first gate electrode arranged on the gate insulating layer and which overlaps the first semiconductor layer in the thickness direction; and
   a second semiconductor layer arranged on a same layer as the first channel region of the first semiconductor layer is disposed on such that an entire lower surface of the second semiconductor layer and an entire lower surface of the first channel region directly contacts the same layer.

2. The display device of claim 1, further comprising a buffer layer arranged between the substrate and the first and second stressors and which defines a first groove and a second groove, respectively,
   wherein a portion of the first stressor is buried in the first groove, and
   a portion of the second stressor is buried in the second groove.

3. The display device of claim 1, further comprising
   a buffer layer arranged between the substrate and the first and second stressors and which defines a first through-hole and a second through-hole, respectively, both exposing a portion of the substrate,
   wherein a portion of the first stressor is buried in the first through-hole, and
   a portion of the second stressor is buried in the second through-hole.

4. The display device of claim 1, wherein a distance from a bottom surface of the substrate to a top surface of the first channel region in a thickness direction is less than a distance from the bottom surface of the substrate to a top surface of the first source region.

5. The display device of claim 1, wherein a first thin-film transistor includes the first semiconductor layer and the first gate electrode,
   wherein the first thin-film transistor is a switching thin-film transistor.

6. The display device of claim 1, wherein each of the first stressor and the second stressor has a compressive film stress.

7. The display device of claim 1, wherein a distance between particles of a material in the first stressor and a distance between particles of a material in the second stressor each are greater than a distance between particles of a material in the first semiconductor layer.

8. A display device comprising:
   a first semiconductor layer arranged on a buffer layer and including a first channel region directly contacting the buffer layer, a first source region, and a first drain region;
   a first stressor arranged between the buffer layer and the first semiconductor layer and which is overlapped by the first source region in a thickness direction of the first semiconductor layer;
   a second stressor arranged between the buffer layer and the first semiconductor layer and which is overlapped by the first drain region in the thickness direction, the second stressor being spaced apart from the first stressor;
   a second semiconductor layer arranged directly on the buffer layer such that an entire lower surface of the second semiconductor layer contacts the buffer layer;
   a gate insulating layer arranged on the first semiconductor layer and the second semiconductor layer;
   a first gate electrode arranged on the gate insulating layer and which overlaps the first semiconductor layer in the thickness direction; and
   a second gate electrode arranged on the gate insulating layer and which overlaps the second semiconductor layer in the thickness direction.

* * * * *